United States Patent
Shimoishizaka et al.

(10) Patent No.: US 6,812,573 B2
(45) Date of Patent: Nov. 2, 2004

(54) SEMICONDUCTOR DEVICE AND METHOD FOR MANUFACTURING THE SAME

(75) Inventors: Nozomi Shimoishizaka, Kyoto (JP); Ryuichi Sahara, Hirakata (JP); Yoshifumi Nakamura, Neyagawa (JP); Takahiro Kumakawa, Takatsuki (JP); Shinji Murakami, Yawata (JP); Yutaka Harada, Kyoto (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 09/886,971

(22) Filed: Jun. 25, 2001

(65) Prior Publication Data

US 2001/0033021 A1 Oct. 25, 2001

Related U.S. Application Data

(63) Continuation of application No. 09/381,381, filed as application No. PCT/JP98/02397 on May 28, 1998, now Pat. No. 6,313,532.

(30) Foreign Application Priority Data

Jun. 6, 1997 (JP) ............................................. 9-148860
Mar. 19, 1998 (JP) ........................................... 10-069675

(51) Int. Cl.$^7$ ............................................. H01L 23/48
(52) U.S. Cl. ...................... 257/759; 257/737; 257/738; 257/773; 257/780; 257/792
(58) Field of Search ................................ 257/737, 738, 257/759, 773, 780, 787, 792, 793

(56) References Cited

U.S. PATENT DOCUMENTS

| | | |
|---|---|---|
| 5,327,013 A | 7/1994 | Moore et al. |
| 5,567,981 A | 10/1996 | Bhansali et al. |
| 5,900,674 A * | 5/1999 | Wojnarowski et al. ...... 257/774 |
| 6,097,087 A | 8/2000 | Farnworth et al. |
| 6,111,317 A * | 8/2000 | Okada et al. ................ 257/737 |
| 6,211,572 B1 * | 4/2001 | Fjelstad et al. .............. 257/781 |
| 6,255,737 B1 | 7/2001 | Hashimoto |

FOREIGN PATENT DOCUMENTS

| | | | |
|---|---|---|---|
| JP | 64-001257 | 1/1989 | |
| JP | 04-280458 | 10/1992 | |
| JP | 08-102466 | 4/1996 | |
| JP | 08-504063 | 4/1996 | |
| JP | 08-203906 | 8/1996 | |
| JP | 08-222571 | 8/1996 | |
| JP | 08-250498 | 9/1996 | |
| JP | 08-330313 | 12/1996 | |
| JP | 08-330313 A * | 12/1996 | ......... H01L/21/321 |
| JP | 10-092865 | 4/1998 | |
| WO | WO 98/25298 | 6/1998 | |

OTHER PUBLICATIONS

Notice of Reasons of Rejection, Patent Application No. 10–069675 Mailing Date: Feb. 5, 2002, Mailing No. 2925390105.

European Search Report Dec. 12, 2001, Application No. 98921896.1–2203–JP9802397.

* cited by examiner

Primary Examiner—Tom Thomas
Assistant Examiner—Matthew E. Warren
(74) Attorney, Agent, or Firm—Nixon Peabody LLP; Donald R. Studebaker (57) ABSTRACT

A low elasticity layer (20) having an opening in an electrode arranging area where element electrodes are disposed is provided on a main surface of a semiconductor substrate (10). On the low elasticity layer (20), lands (32) serving as external electrodes are disposed, and pads (30) on the element electrodes, the lands (32) and metal wires (31) for connecting them are integrally formed as a metal wiring pattern (33). A solder resist film (50) having an opening for exposing a part of each land (32) is formed, and a metal ball (40) is provided on the land (32) in the opening. The low elasticity layer (20) absorbs thermal stress and the like caused in heating or cooling the semiconductor device, so as to prevent disconnection of the metal wires (31).

15 Claims, 7 Drawing Sheets

PRIOR ART

SEMICONDUCTOR DEVICE AND METHOD FOR MANUFACTURING THE SAME

This Application is a CONTINUATION of Ser. No. 09/381,381 filed on Sep. 20, 1999, which is now U.S. Pat. No. 6,313,532 which is a 371 of PCT/JP98/02397 filed May 28, 1998.

TECHNICAL FIELD

The present invention relates to a semiconductor device, for use in information communication equipment and office electronic equipment, applicable to high density packaging, containing a semiconductor integrated circuit unit and including wires and the like to be connected with external terminals, and a method for manufacturing the semiconductor device.

BACKGROUND ART

In accordance with recent development of compact and high level function electronic equipment, a semiconductor device including a semiconductor integrated circuit unit is also required of compactness, high packaging density and high speed in packaging work. For example, as memory packages, an LOC (lead on chip), a SON (small outline non-lead), a μBGA (micro-ball grid array) using a TAB tape (disclosed in National Publication of translated version No. 06-504408) and the like have been developed.

Now, a conventional semiconductor device designated as μBGA and a method for manufacturing the device will be described with reference to drawings.

Figure 10:
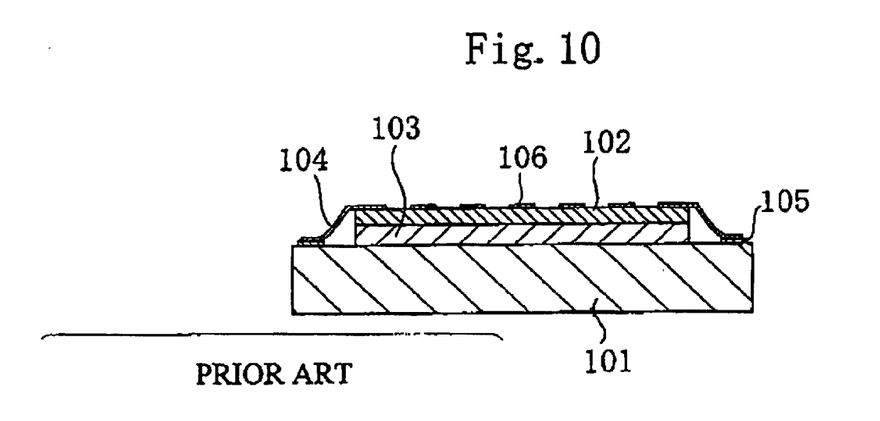
FIG. 10 is a sectional view of a conventional semiconductor device including a low elasticity layer.

FIG. 10 is a sectional view of the conventional semiconductor device designated as μBGA. In FIG. 10, a reference numeral 101 denotes a semiconductor chip including semiconductor elements, a reference numeral 102 denotes a wiring circuit sheet of flexible sheet formed on the semiconductor chip 101, a reference numeral 103 denotes a flexible low elasticity material disposed between the semiconductor chip 101 and the wiring circuit sheet 102, a reference numeral 104 denotes a partial lead corresponding to a part of a wiring layer, a reference numeral 105 denotes an element electrode electrically connected with the semiconductor element included in the semiconductor chip 101, and a reference numeral 106 denotes an electrode formed on the surface of the wiring circuit sheet 102 for attaining electric connection with an external device.

As is shown in FIG. 10, in the conventional semiconductor device designated as μBGA, the wiring circuit sheet 102 is formed on the semiconductor chip 101 with the low elasticity material 103 sandwiched therebetween, and the element electrode 105 on the semiconductor chip 101 is electrically connected with the electrode 106 on the wiring circuit sheet 102 through the partial lead 104.

Next, the method for manufacturing the aforementioned conventional semiconductor device will be described with reference to the same drawing.

First, the wiring circuit sheet 102 in the shape of flexible sheet is adhered onto the semiconductor chip 101 with the low elasticity material 103 sandwiched therebetween. The wiring circuit sheet 102 includes a wiring pattern therein, the electrode 106 to be connected with the wiring pattern is formed on the wiring circuit sheet 102, and the partial lead 104 extends from the electrode 106. In this case, the low elasticity material 103 is an insulating material having an adhesive function.

Next, the partial lead 104 and the element electrode 105 are electrically connected with each other by using a conventional thermo compression bonding technique generally used in "TAB" (tape automated bonding) or an ultrasonic bonding technique. In this manner, the semiconductor device is manufactured.

Specifically, owing to the aforementioned structure of the semiconductor device, the semiconductor device can be electrically connected with external equipment through a large number of electrodes 106 two-dimensionally formed on the wiring circuit sheet 102, while suppressing stress. Accordingly, information communication equipment, office electronic equipment and the like can be downsized.

PROBLEMS TO BE SOLVED BY THE INVENTION

The aforementioned conventional semiconductor device has, however, the following problems:

First, in the conventional semiconductor device, it is necessary to previously fabricate the wiring circuit sheet 102, which increases the number of manufacturing processes. Also, the wiring circuit sheet 102 itself is expensive. Moreover, in order to adhere the wiring circuit sheet 102 onto the semiconductor chip 101 with the low elasticity material 103 sandwiched therebetween, it is necessary to provide a high performance placement machine, which increases the equipment cost. As a result, the manufacturing cost for the semiconductor device is increased as a whole.

Secondly, in connecting the element electrode 105 with the partial lead 104 extending from the wiring circuit sheet 102, in particular when a fine line is used for the connection, the width and the thickness of the partial lead 104 are decreased, and hence the shape of the partial lead 104 becomes unstable, resulting in making the connection with the element electrode 105 difficult. Accordingly, the manufacturing cost is increased as well as the reliability of the connection is poor.

Thirdly, owing to this structure, such a semiconductor device cannot be manufactured until the semiconductor chip 101 is cut off from a wafer. Therefore, the semiconductor device is poor in rapidness in the manufacture, and cannot be tested in the state of a wafer. This is a serious obstacle to reduction of the manufacturing cost of the semiconductor device.

The present invention was devised to overcome the aforementioned conventional problems, and the object is providing a semiconductor device with high reliability, high packaging density and low cost that can be fabricated at wafer level up to a state close to the ultimate step of the manufacture, and a method for manufacturing the semiconductor device.

DISCLOSURE OF THE INVENTION

In order to achieve the aforementioned object, the following semiconductor device and method for manufacturing a semiconductor device are herein disclosed.

The basic semiconductor device of this invention comprises a semiconductor substrate including semiconductor elements; element electrodes arranged on a main surface of the semiconductor substrate and electrically connected with the semiconductor elements; an elastic material layer formed on the main surface of the semiconductor substrate from an insulating elastic material; an opening formed by partially removing the elastic material layer for exposing at least the element electrodes on the semiconductor substrate; a metal wiring layer continuously formed to stretch from the element electrodes over the elastic material layer; and external electrodes formed as a part of the metal wiring layer on the elastic material layer for electrical connection with external equipment.

In this manner, the external electrodes of the metal wiring layer are formed on the elastic material layer. Therefore, in mounting the semiconductor device on a mother board, stress applied to a connection part due to a difference in the coefficient of thermal expansion between the mother board and the semiconductor device can be absorbed by the elasticity of the elastic material layer. Thus, a semiconductor device having an improved function to relax stress can be realized.

Furthermore, since the metal wiring layer connected with the element electrodes is integrated with the external electrodes, the metal wiring layer can be formed by patterning a metal film deposited on the semiconductor substrate. Accordingly, there is no need to provide a wiring circuit sheet and equipment for the wiring circuit sheet as in the aforementioned conventional semiconductor device. Also in the manufacture, there is no need to conduct a process for connecting a partial lead with an element electrode through thermo bonding as in the procedures for the conventional semiconductor device. As a result, the manufacturing equipment and the number of manufacturing procedures can be reduced, and difficulty in the connection can be avoided. Thus, the manufacturing cost can be reduced.

In addition, the manufacturing procedures can be simplified because the metal wiring layer can be formed even when the semiconductor substrate is in the state of a wafer.

In the semiconductor device, the semiconductor substrate can be in the state of a wafer or in the state of a chip cut off from a wafer.

In the semiconductor device, the elastic material layer preferably has a wedged section inclined to the surface of the semiconductor substrate or a round-cornered section in an end portion thereof in the vicinity of the opening.

When the elastic material layer has any of these sections, stress can be avoided from being collectively applied to a part of the metal wiring layer, and hence, disconnection of the metal wiring layer and the like can be prevented, resulting in improving the reliability of the semiconductor device.

The semiconductor device preferably further comprises a protecting film formed to cover the metal wiring layer and having a property to repel a conductive material; and openings each formed through the protecting film for exposing at least a part of each of the external electrodes of the metal wiring layer, and an external electrode terminal is preferably formed at least on a part of each of the external electrodes exposed in the openings of the protecting film.

In this manner, while keeping normal connection between the metal wiring layer and wiring electrodes on a mother board having no electric short-circuit, the semiconductor device can be satisfactorily mounted on the mother board.

In the semiconductor device, the external electrode terminal can be made from a metal ball formed to be in contact with each of the external electrodes or a conductive projection formed to be in contact with each of the external electrodes.

Alternatively, at least a part of each of the external electrodes exposed in the openings of the protecting film can also function as the external electrode terminal.

The semiconductor device can further comprise a passivation film for protecting the semiconductor elements formed on the semiconductor substrate and having openings above the element electrodes, and the elastic material layer can be formed on the passivation film.

In this manner, a semiconductor device with higher reliability can be obtained.

The basic method for manufacturing a semiconductor device of this invention comprises a first step of forming an elastic material layer from an insulating material on a semiconductor substrate including semiconductor elements and element electrodes electrically connected with the semiconductor elements; a second step of forming an opening in the elastic material layer for exposing the element electrodes by selectively removing the elastic material layer in areas above the element electrodes; and a third step of forming, on the substrate bearing the elastic material layer and the opening, a metal wiring layer stretching from the element electrodes exposed in the opening over the elastic material layer, a part of the metal wiring layer functioning as an external electrode for electric connection with external equipment.

In this method, the metal wiring layer connected with the element electrodes can be formed integrally with the external electrodes by patterning a metal film deposited on the semiconductor substrate. Accordingly, there is no need to provide a wiring circuit sheet and equipment for the wiring circuit sheet as in the conventional semiconductor device. In addition, there is no need to conduct a process for connecting the partial lead with the element electrode as in the manufacturing procedures for the conventional semiconductor device. Accordingly, the manufacturing equipment and the number of the manufacturing procedures can be reduced. Furthermore, since the metal wiring layer can be electrically connected with the element electrodes merely by forming the metal wiring layer on the element electrodes, difficulty as in the connection between the partial lead and the element electrode in the conventional semiconductor device can be avoided. As a result, the basic semiconductor device of the invention can be easily realized with the manufacturing cost reduced.

In the basic method for manufacturing a semiconductor device, the first through third steps are preferably conducted on the semiconductor substrate in the state of a wafer, and the method preferably further comprises, after the third step, a step of dividing the wafer into semiconductor chips.

In this manner, the elastic material layer, the metal wiring layer and the like can be formed in a large number of chip areas with retaining the semiconductor substrate in the state of a wafer before dividing into chips, and hence, the manufacturing cost can be largely reduced.

The basic method for manufacturing a semiconductor device can further comprise, before the first step, a step of dividing a wafer into semiconductor chips, and the first through third steps can be conducted on the semiconductor substrate in the state of a chip.

In the method for manufacturing a semiconductor device, in the second step, the elastic material layer is preferably formed to have a wedged section inclined to a surface of the semiconductor substrate in an end portion thereof in the vicinity of the opening.

Thus, a highly reliable metal wiring layer hardly suffering disconnection can be formed.

The method for manufacturing a semiconductor device preferably further comprises, after the third step, a step of forming a protecting film for covering the metal wiring layer excluding at least a part of the external electrodes.

Thus, the external electrodes of the semiconductor device can be easily and rapidly connected with wires of a mother board by using a connecting member such as solder.

The method for manufacturing a semiconductor device preferably further comprises a step of providing a metal ball on each of the external electrodes of the metal wiring layer.

Thus, the semiconductor device can be very rapidly mounted on a mother board by using the metal balls.

The basic method for manufacturing a semiconductor device can further comprises, after the third step, a step of testing the semiconductor device by installing a testing board including terminals electrically connectable with the external electrodes above the semiconductor substrate.

Thus, the semiconductor device can be tested while absorbing, by the elastic material layer, stress applied to the metal wiring layer through the external electrodes during the test.

BEST MODE FOR CARRYING OUT THE INVENTION

Now, embodiments of the present invention will be described with reference to the accompanying drawings.
Embodiment 1

Figure 1:
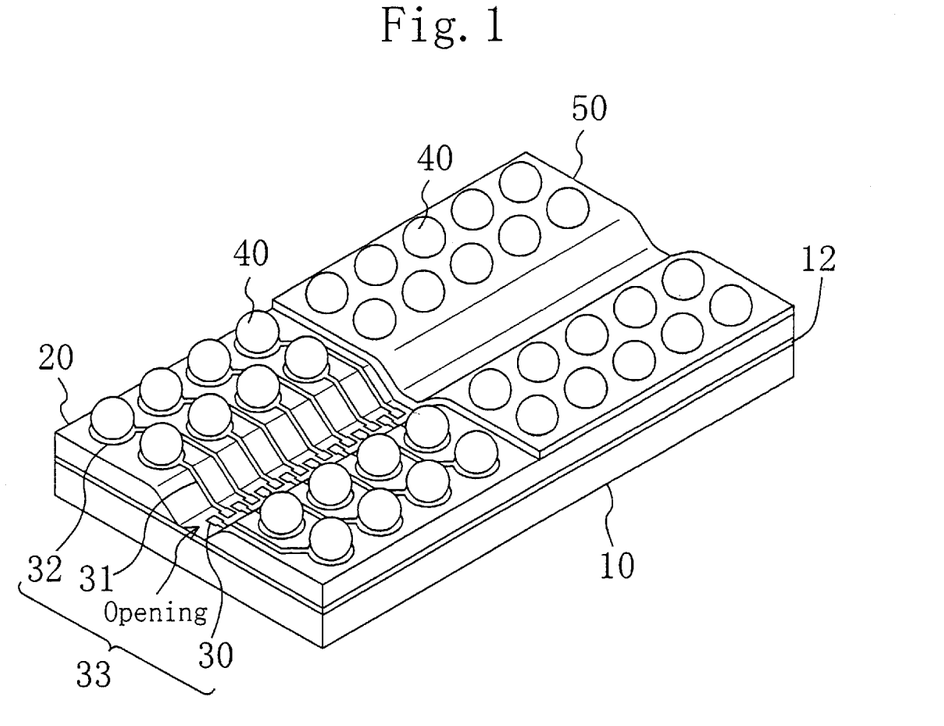
FIG. 1 is a perspective view for showing the structure of a semiconductor device according to Embodiment 1 with a solder resist film partially removed.

First, Embodiment 1 of the invention will be described with reference to FIGS. 1 through 4. FIG. 1 is a perspective view of a semiconductor device of this embodiment with a part of a solder resist film removed, FIG. 2 is a sectional view of the semiconductor device of this embodiment, and FIGS. 3(a) through 3(e) and 4(a) through 4(d) are sectional views for showing manufacturing procedures for the semiconductor device of the embodiment.

Figure 2:
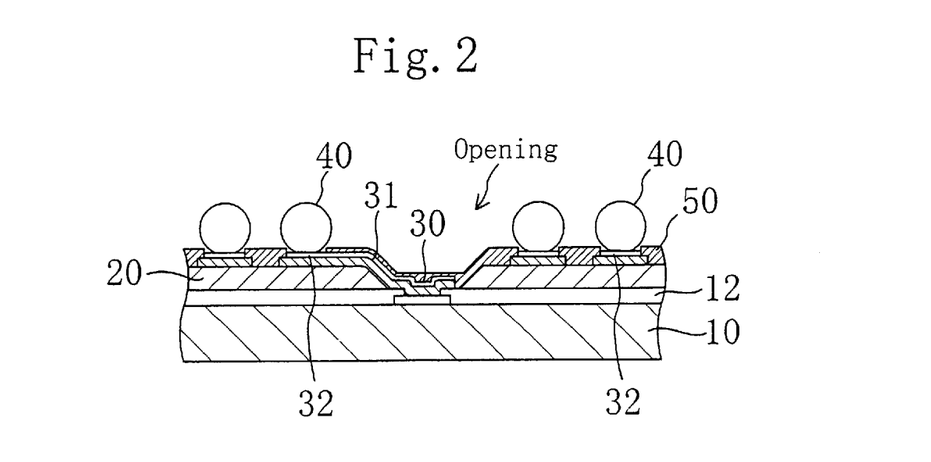
FIG. 2 is a sectional view of the semiconductor device of Embodiment 1.

In FIGS. 1 and 2, a reference numeral 10 denotes a semiconductor substrate containing a semiconductor integrated circuit including semiconductor elements such as a transistor. The semiconductor substrate 10 can be in the state of a wafer or in the state of a chip cut off from a wafer. In a part (electrode arranging area) of the main surface of the semiconductor substrate 10, pads 30 to be connected with element electrodes 11 of the semiconductor substrate 10 are disposed. In this embodiment, when the semiconductor substrate has been divided into a chip, the electrode arranging area is positioned at the center thereof. Also, on the main surface of the semiconductor substrate 10, a low elasticity layer 20 of an insulating material with a low elastic modulus is formed in an area excluding the electrode arranging area where the pads 30 are disposed. The low elasticity layer 20 has a wedged slope portion meeting the main surface of the semiconductor substrate 10 where the pad 30 are formed. In other words, the low elasticity layer has an end portion that is not perpendicular to the main surface of the semiconductor substrate 10 but in the wedged shape including no acute-angled part. On the low elasticity layer 20, lands 32 each functioning as an external electrode for inputting/outputting a signal between the semiconductor elements in the semiconductor substrate 10 and external equipment are formed, and a metal wire 31 is provided for connecting each land 32 with each pad 30. The pads 30, the metal wires 31 and the lands 32 are formed from the same metal layer, and together form a metal wiring pattern 33. On each land 32, a metal ball 40 functioning as an external electrode terminal is provided. Furthermore, the entire semiconductor device is covered with a solder resist film 50 so as to expose merely areas where the metal balls 40 are formed. Specifically, each metal ball 40 is connected with each land 32 exposed in an opening of the solder resist film 50.

An area excluding the pads 30 on the main surface of the semiconductor substrate 10 is covered with a passivation film 12.

In the semiconductor device of this embodiment, the metal wire 31 is formed on the underlying low elasticity layer 20. Therefore, in mounting the semiconductor device on a mother board such as a print wiring board, even when stress such as thermal stress is applied to the metal wire 31 while heating or cooling the semiconductor device, the stress applied to the metal wire 31 is relaxed. Accordingly, disconnection of the metal wire 31 can be prevented during the substrate mounting, resulting in realizing a wiring structure with high reliability.

Moreover, since the lands 32 serving as the external electrode terminals are two-dimensionally arranged on the main surface of the semiconductor device, a large number of external electrode terminals can be disposed in a small area. In addition, the pads 30 and the lands 32 can be connected through the metal wires 31 that can be formed through patterning. Accordingly, a compact and thin semiconductor device for multi-pin application can be obtained.

In addition, the element electrodes 11 of the semiconductor substrate 10 and the external connection terminals (i.e., the lands 32) are connected not through partial leads as in the conventional technique but through the metal wires 31 that can be formed through patterning such as etching. Therefore, the semiconductor device is suitable to refinement and multi-pin application.

Furthermore, the metal balls 40 serving as the external electrode terminals are provided on the lands 32 connected with the metal wires 31, and the process for mounting the semiconductor device on a mother board such as a print wiring board can be very easily and rapidly conducted. Also in this case, thermal stress generated from the metal balls 40 with a large thermal capacity can be absorbed by the low elasticity layer 20.

In particular, the end portion of the low elasticity layer 20 formed in the electrode arranging area on the main surface of the semiconductor substrate 10 has a wedged section including no acute-angled part. Therefore, the semiconductor device is characterized by the metal wires 31 easily formed and hardly disconnected.

In this embodiment and other embodiments described below, the low elasticity layer 20 preferably has a thickness of 10 through 150 μm. Also, the low elasticity layer 20 preferably has an elastic modulus (Young's modulus) in a range between 10 and 2000 kg/mm², and more preferably in a range between 10 and 1000 kg/mm². Furthermore, the low elasticity layer 20 preferably has a coefficient of linear expansion of 50 through 200 ppm/° C., and more preferably 10 through 100 ppm/° C.

Next, a method of manufacturing the semiconductor device of this embodiment will be described with reference to FIGS. 3(a) through 3(e) and 4(a) through 4(d). FIGS. 3(a) through 3(e) and 4(a) through 4(d) are sectional views for showing manufacturing procedures for attaining the structure of the semiconductor device shown in FIGS. 1 and 2.

Figure 3A:
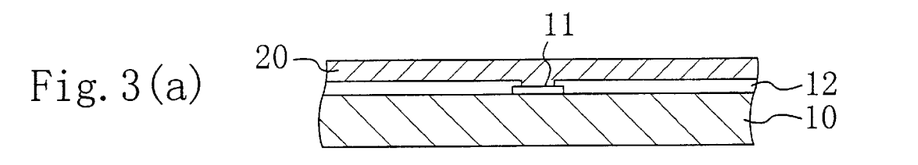
FIGS. 3(a) through 3(e) are sectional views for showing procedures up to formation of a thick metal layer on a thin metal layer in the manufacturing process for the semiconductor device of Embodiment 1.

First, as is shown in FIG. 3(a), on the element electrode 11 and the passivation film 12 respectively formed on the main surface of the semiconductor substrate 10, a photosensitive insulating material is coated in a thickness of approximately 100 μm and dried, thereby forming an insulating material film 21.

In order to reduce thermal stress caused in mounting the present semiconductor device on a substrate, the coating thickness of the photosensitive insulating material film 21 should be as large as possible as far as procedures following the coating are not affected, and can be, for example, approximately 500 μm or approximately 1 mm.

Figure 3B:
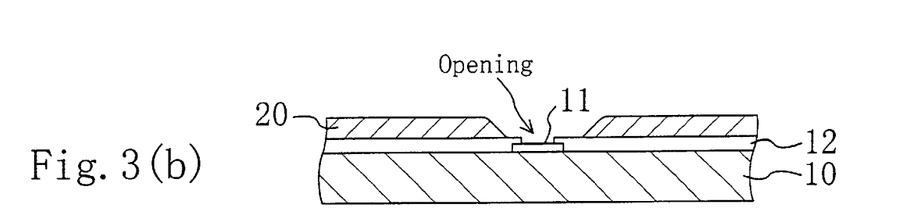

Next, as is shown in FIG. 3(b), the dried insulating material film 21 is successively exposed and developed, thereby forming the low elasticity layer 20 including an opening correspondingly to the element electrode 11 of the semiconductor substrate 10. In this case, for example, the exposure is conducted by using not collimated light but scattered light, so that the section of the low elasticity layer 20 can be in a wedged shape including no acute-angled part instead of being perpendicular to the main surface of the semiconductor substrate 10 at its end portion close to the opening.

The photosensitive insulating material film 21 can be made from ester-linkage polyimide or a polymer such as acrylate epoxy as far as it has a low elastic modulus and insulating property.

Furthermore, the photosensitive insulating material film 21 is not required to be formed by drying a liquid material but can be formed by using a material previously formed into a film shape. In this case, the film-shaped insulating material film 21 is adhered onto the semiconductor substrate 10, and the opening can be formed in the insulating material film 21 through exposure and development, so that the element electrode 11 of the semiconductor substrate 10 can be exposed.

Moreover, the insulating material for the insulating material film 21 is not required to have photosensitive property. When an insulating material without photosensitive property is used, the element electrode 11 of the semiconductor substrate 10 can be exposed through a mechanical process using a laser or plasma or a chemical process such as etching.

Figure 3C:
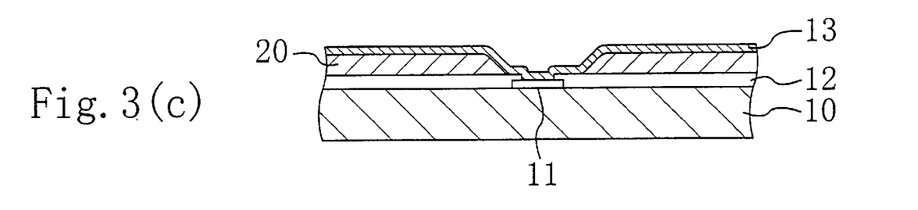

Next, as is shown in FIG. 3(c), on the main surface of the semiconductor substrate 10, a thin metal layer 13 including, for example, a Ti film with a thickness of approximately 0.2 μm and a Cu film formed thereon with a thickness of approximately 0.5 μm is formed through vacuum evaporation, sputtering, CVD or electroless plating.

Figure 3D:
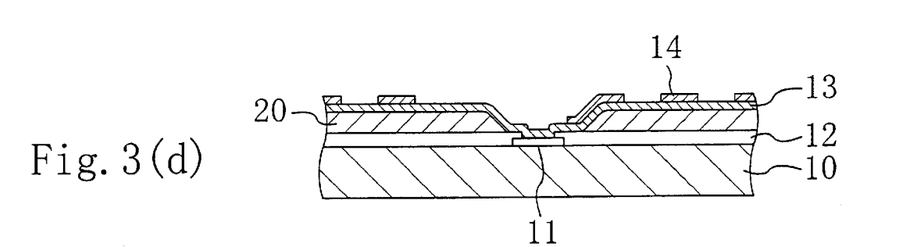

Then, as is shown in FIG. 3(d), the thin metal layer 13 is coated with a negative photosensitive resist, and a portion of the resist corresponding to a desired pattern for the completed device is cured with an unexposed portion removed, thereby forming a plating resist film 14.

The negative photosensitive resist is used in forming the plating resist film 14 in this embodiment, but it goes without saying that a positive photosensitive resist can be used instead.

Figure 3E:
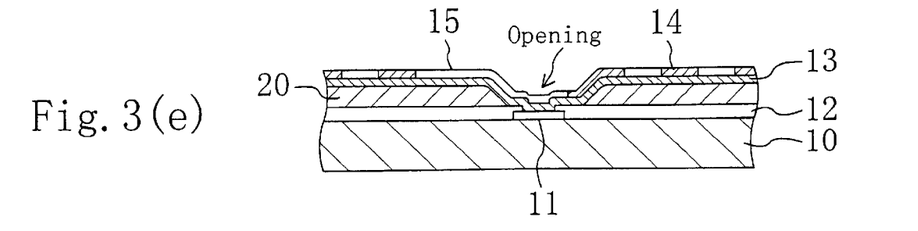

Thereafter, as is shown in FIG. 3(e), on portions of the thin metal layer 13 excluding portions where the plating resist film 14 is formed, a thick metal layer 15 of, for example, a Cu film is selectively formed in a thickness of, for example, approximately 20 μm.

Figure 4A:
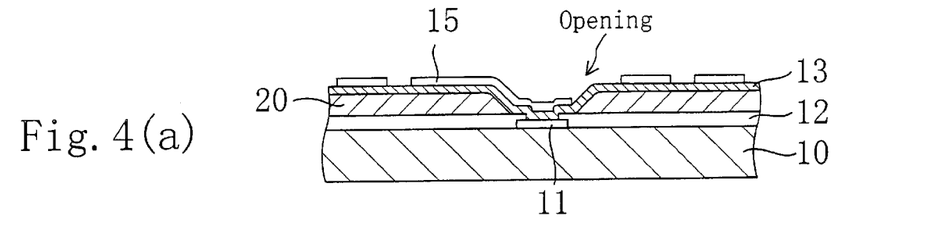
FIGS. 4(a) through 4(d) are sectional views for showing procedures following removal of a plating resist film in the manufacturing process for the semiconductor device of Embodiment 1.

Next, as is shown in FIG. 4(a), after forming the thick metal layer 15, the plating resist film 14 is melted and removed.

Figure 4B:
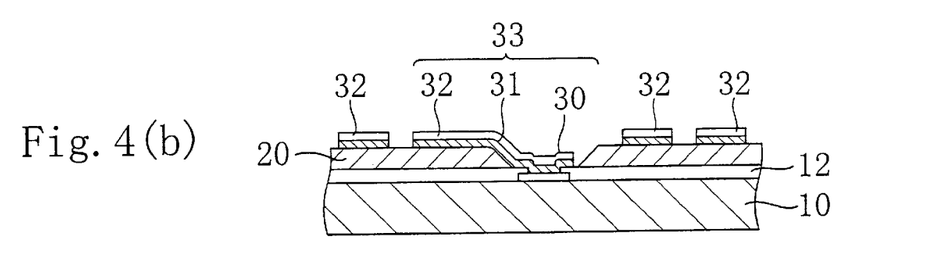

Then, as is shown in FIG. 4(b), the entire surface is etched by using an etching solution that can melt the thin metal layer 13 and the thick metal layer 15, such as a cupric chloride solution against a Cu film and an EDTA solution against a Ti film. Thus, the thin metal layer 13 having a smaller thickness than the thick metal layer 15 is priorly removed. Through this procedure, the desired metal wiring pattern 33 including the pad 30, the metal wire 31 and the land 32 is formed on the main surface of the semiconductor substrate 10.

At this point, after removing the plating resist film 14, an etching resist film having a desired pattern shape can be formed by photolithography so as to protect the thick metal layer 15.

Figure 4C:
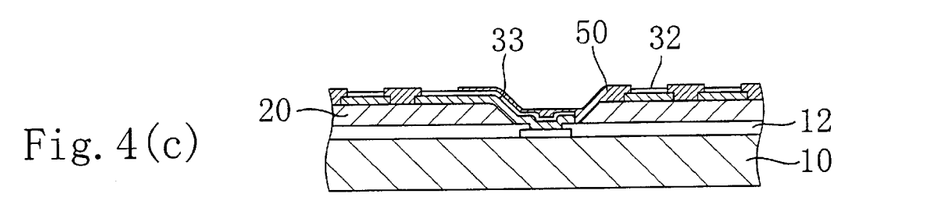

Next, as is shown in FIG. 4(c), the low elasticity layer 20 is coated with a photosensitive solder resist film, which is formed into the solder resist film 50 through the photolithography with the land 32 alone exposed. The solder resist film 50 protects the pad 30 and the metal wire 31, namely, the metal wiring pattern 33 excluding the land 32, from melted solder.

Figure 4D:
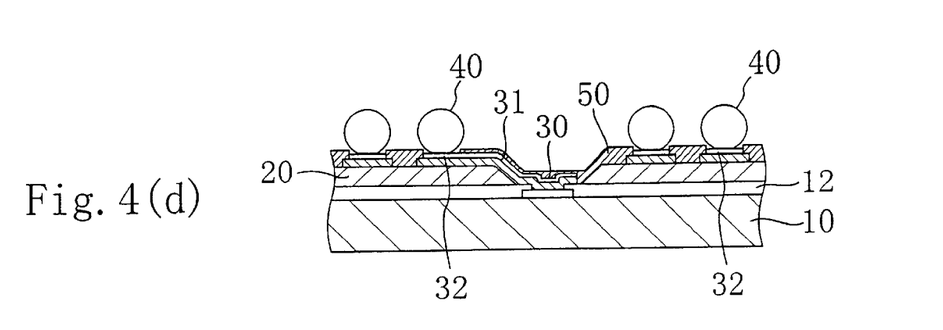

Then, as is shown in FIG. 4(d), the metal ball 40 of solder, solder-plated copper or nickel is disposed on the land 32, and the metal ball 40 and the land 32 are melted to be connected. Through these procedures, the semiconductor device of this embodiment can be manufactured.

In the method for manufacturing the semiconductor device of this embodiment, the end portion at the opening of the low elasticity layer 20 for exposing the element electrode 11 of the semiconductor substrate 10 is not provided with a step but inclined so that the low elasticity layer 20 can smoothly meet the surface of the semiconductor substrate 10. As a result, the metal wire 31 can be easily formed and hardly disconnected.

Furthermore, as a material for the thin metal layer 13 and the thick metal layer 15, Cu is used in this embodiment, but Cr, W, Ti/Cu, Ni or the like can be used instead. Also, the thin metal layer 13 and the thick metal layer 15 can be made from different metal materials, so that an etchant for selectively etching the thin metal layer 13 alone can be used in the ultimate etching process.

Embodiment 2

Figure 5:
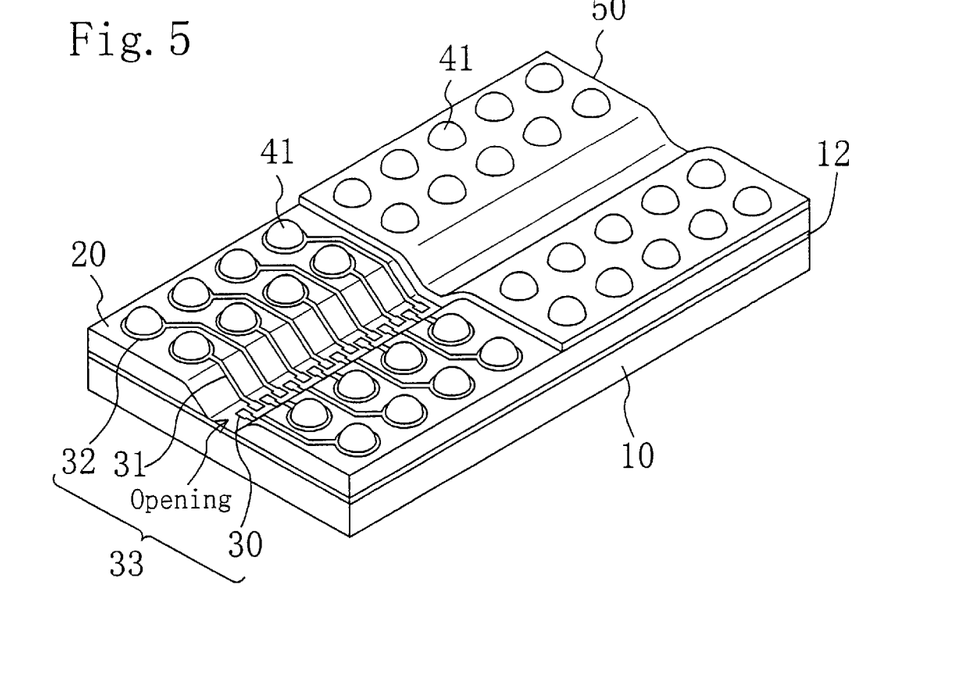
FIG. 5 is a perspective view for showing the structure of a semiconductor device including a conductive projection as an external electrode terminal according to Embodiment 2 with a solder resist film partially removed.

Next, Embodiment 2 of the invention will be described with reference to the drawing. FIG. 5 is a perspective view of a semiconductor device according to Embodiment 2 with a part of a solder resist film removed.

In FIG. 5, a reference numeral 10 denotes a semiconductor substrate containing a semiconductor integrated circuit including semiconductor elements such as a transistor. The semiconductor substrate 10 can be in the state of a wafer or in the state of a chip cut off from a wafer. On a part (electrode arranging area) of the main surface of the semiconductor substrate 10, pads 30 to be connected with element electrodes (not shown) of the semiconductor substrate 10 are disposed. When the semiconductor substrate has been divided into a chip, the electrode arranging area is positioned at the center thereof in this embodiment. Also, on the main surface of the semiconductor substrate 10, a low elasticity layer 20 of an insulating material with a low elastic modulus is formed in an area excluding the electrode arranging area where the pads 30 are disposed. The low elasticity layer 20 has a wedged slope portion meeting the main surface of the semiconductor substrate 10 where the pads 30 are formed. In other words, the low elasticity layer has an end portion that is not perpendicular to the main surface of the semiconductor substrate 10 but in the wedged shape including no acute-angled part. On the low elasticity layer 20, lands 32 each functioning as an external electrode for inputting/outputting a signal between the semiconductor element of the semiconductor substrate 10 and external equipment are formed, and each land 32 and each pad 30 are connected through a metal wire 31. The pads 30, the metal wires 31 and the lands 32 are made from the same metal layer, and together form a metal wiring pattern 33. An area excluding the pads 30 on the main surface of the semiconductor substrate 10 is covered with a passivation film 12. The above-described structure is the same as that of the semiconductor device of Embodiment 1 shown in FIG. 1.

As a characteristic of the semiconductor device of this embodiment, on the land 32 exposed in the opening of the solder resist film 50, a conductive projection 41 is formed as the external electrode terminal instead of the metal ball 40.

Examples of the material for the conductive projection 41 are a solder bump formed on the land 32 by printing and melting solder cream, a solder bump formed by dipping in melted solder, a nickel/gold bump formed on the land 32 by electroless plating and the like. However, the material is not limited to those mentioned above.

In the semiconductor device of this embodiment, since the conductive projection 41 is provided as the external electrode terminal instead of the metal ball 40, a troublesome process of successively forming the metal balls 40 on the respective lands 32 is not necessary, resulting in realizing a semiconductor device with lower cost.

Embodiment 3

Next, Embodiment 3 of the invention will be described with reference to the drawing.

Figure 6:
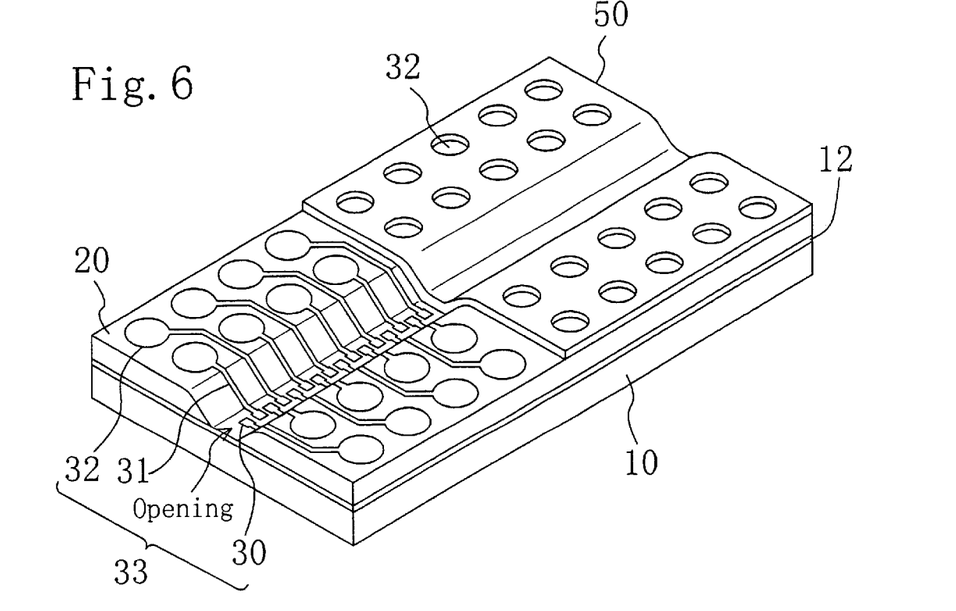
FIG. 6 is a perspective view for showing the structure of a semiconductor device including a land of a metal wiring layer functioning as an external electrode terminal according to Embodiment 3 with a solder resist film partially removed.

FIG. 6 is a perspective view of a semiconductor device of Embodiment 2 with a part of a solder resist film removed.

In FIG. 6, a reference numeral 10 denotes a semiconductor substrate containing a semiconductor integrated circuit including semiconductor elements such as a transistor. The semiconductor substrate 10 can be in the state of a wafer or in the state of a chip cut off from a wafer. On a part (electrode arranging area) of the main surface of the semiconductor substrate 10, pads 30 to be connected with element electrodes (not shown) of the semiconductor substrate 10 are disposed. When the semiconductor substrate has been divided into a chip, the electrode arranging area is positioned at the center thereof in this embodiment. Also, on the main surface of the semiconductor substrate 10, a low elasticity layer 20 of an insulating material with a low elastic modulus is formed in an area excluding the electrode arranging area where the pads 30 are disposed. The low elasticity layer 20 has a wedged slope portion meeting the main surface of the semiconductor substrate 10 where the pads 30 are formed. In other words, the low elasticity layer has an end portion that is not perpendicular to the main surface of the semiconductor substrate 10 but in the wedged shape including no acute-angled part. On the low elasticity layer 20, lands 32 each functioning as an external electrode for inputting/outputting a signal between the semiconductor element of the semiconductor substrate 10 and external equipment are formed, and each land 32 and each pad 30 are connected through a metal wire 31. The pads 30, the metal wires 31 and the lands 32 are made from the same metal layer, and together form a metal wiring pattern 33. An area excluding the pads 30 on the main surface of the semiconductor substrate 10 is covered with a passivation film 12. The above-described structure is the same as that of the semiconductor device of Embodiment 1 shown in FIG. 1.

As a characteristic of the semiconductor device of this embodiment, on the land 32 exposed in the opening of the solder resist film 50, neither the metal ball 40 nor the conductive projection 41 is provided but the land 32 itself functions as the external electrode terminal. In other words, the semiconductor device of this embodiment is a land-grid-array (LGA) semiconductor device.

In mounting the semiconductor device of this embodiment on a mother board, the lands 32 can be electrically connected with connection terminals of the mother board with ease by, for example, reflowing solder cream coated on the connection terminals of the mother board.

In this embodiment, since the land 32, that is, a part of the metal wiring pattern 33, is used as the external electrode terminal instead of providing the metal ball 40, the process of successively forming the metal balls 40 or forming the conductive projections 41 of solder or the like is not necessary. As a result, a semiconductor device with very low cost and small height when mounted can be realized.

Embodiment 4

Figure 7:
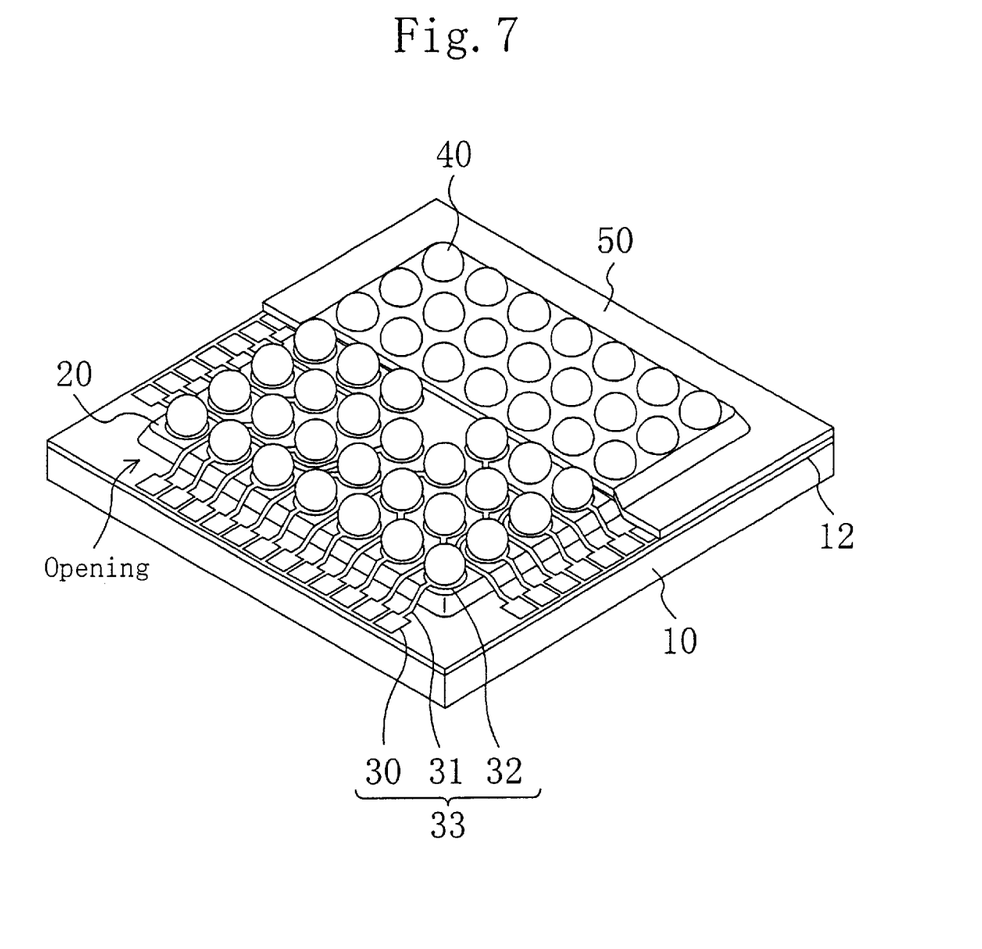
FIG. 7 is a perspective view of a semiconductor device including element electrodes arranged in a peripheral portion according to Embodiment 4 with a solder resist film partially removed.
Figure 8A:
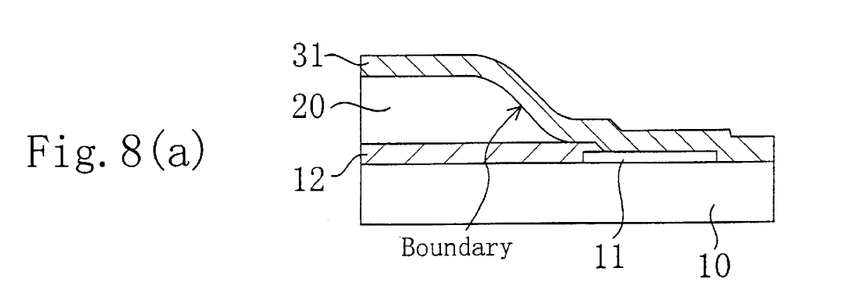
FIGS. 8(a) through 8(d) are partial sectional views of semiconductor devices for showing variation in the sectional shape of an end portion of a low elasticity layer adoptable in Embodiments 1 through 4.
Figure 8B:
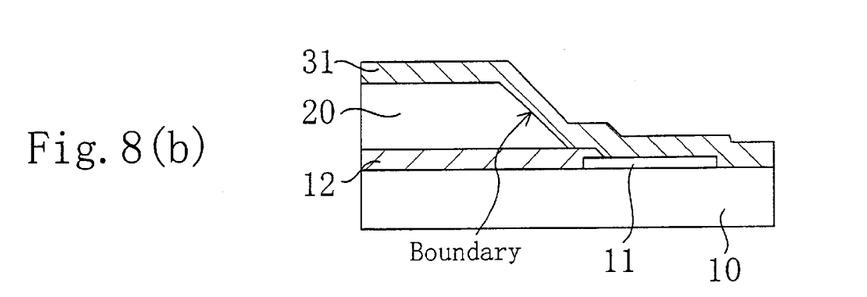
Figure 8C:
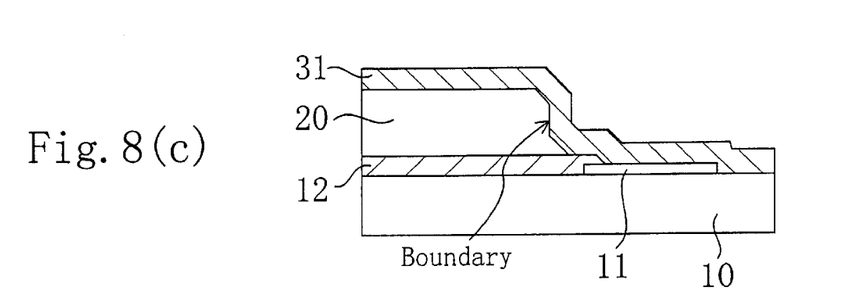
Figure 8D:
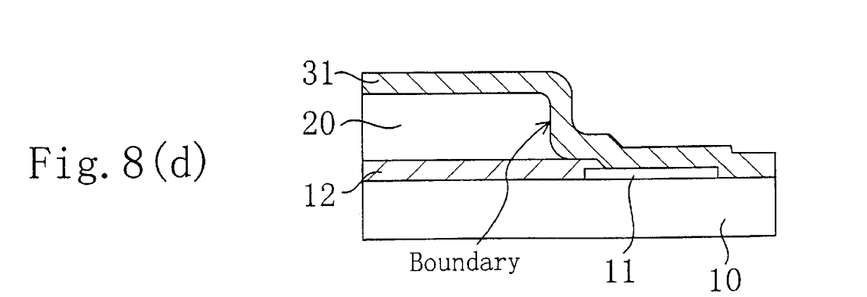

Next, Embodiment 4 will be described with reference to FIG. 7. FIG. 7 is a perspective view of a semiconductor device according to Embodiment 4 with a solder resist film partially removed.

As is shown in FIG. 7, in the semiconductor device of this embodiment, pads 30 to be connected with element electrodes (not shown) of a semiconductor substrate are disposed in a peripheral portion on the main surface of the semiconductor substrate 10 in the state of a chip. Also on the main surface of the semiconductor substrate 10, a low elasticity layer 20 of an insulating material with a low elastic modulus is disposed in an area excluding the peripheral portion where the pads 30 are disposed. The end portion of the low elasticity layer 20 is in a wedged shape as in Embodiment 1 described above. On the low elasticity layer 20 are disposed lands 32 each functioning as an external electrode terminal for inputting/outputting a signal between a semiconductor element of the semiconductor substrate 10 and external equipment. A metal wire 31 is formed so as to extend from the pad 30 on the main surface of the semiconductor substrate 10 over the low elasticity layer 20 to be connected with the land 32. Similarly to Embodiment 1, the pads 30, the metal wires 31 and the lands 32 are integrally formed from the same metal material and together form a metal wiring pattern 33. An area on the main surface of the semiconductor substrate 10 excluding the pads 30 is covered with a passivation film 12. On each land 32, a metal ball 40 serving as a projecting external terminal is provided.

According to this embodiment, the external electrode terminals for attaining electric connection with a mother board are the metal balls 14 (external electrode terminals), which are formed not on the element electrodes linearly arranged with a small pitch in the peripheral of the semiconductor substrate 10 in the state of a chip but on the lands 32 (external electrodes) connected with the element electrodes and arranged with a large pitch in a two-dimensional grid-array. In this manner, the semiconductor device can be two-dimensionally electrically connected with terminals on the mother board through the metal balls 40 in mounting on the mother board. Accordingly, a semiconductor device easily applicable to high density packaging can be realized.

In each of Embodiments 1 through 4, description is given merely on the case where the end portion at the opening of the low elasticity layer, namely, a boundary portion between the low elasticity layer and the semiconductor substrate, is in the shape of a slope, which does not limit the invention. FIGS. 8(a) through 8(d) show specific examples of the shape of the boundary portion between the semiconductor substrate 10 and the low elasticity layer 20, and are sectional views of the low elasticity layer 20 and the metal wire 31 attained when the boundary portion is formed in the shape of a curved slope, a linear slope, a step with an acute-angled corner and a step with a round corner, respectively.

Furthermore, in the method for manufacturing the semiconductor device of any of Embodiments 1 through 4, a semiconductor substrate in a wafer shape can be cut into a chip before forming the low elasticity layer, the wiring pattern, the solder resist film, the metal ball and the like, or a semiconductor substrate in a chip shape can be cut off from a wafer after forming the low elasticity layer, the wiring pattern, the solder resist film and the metal ball on the wafer. Alternatively, a semiconductor substrate in a chip shape can be cut off from a wafer after completing up to any of the procedures for forming the low elasticity layer, the wiring pattern, the solder resist film and the metal ball on the wafer, with the remaining procedures conducted on the semiconductor substrate in a chip shape.

Embodiment 5

Figure 9:
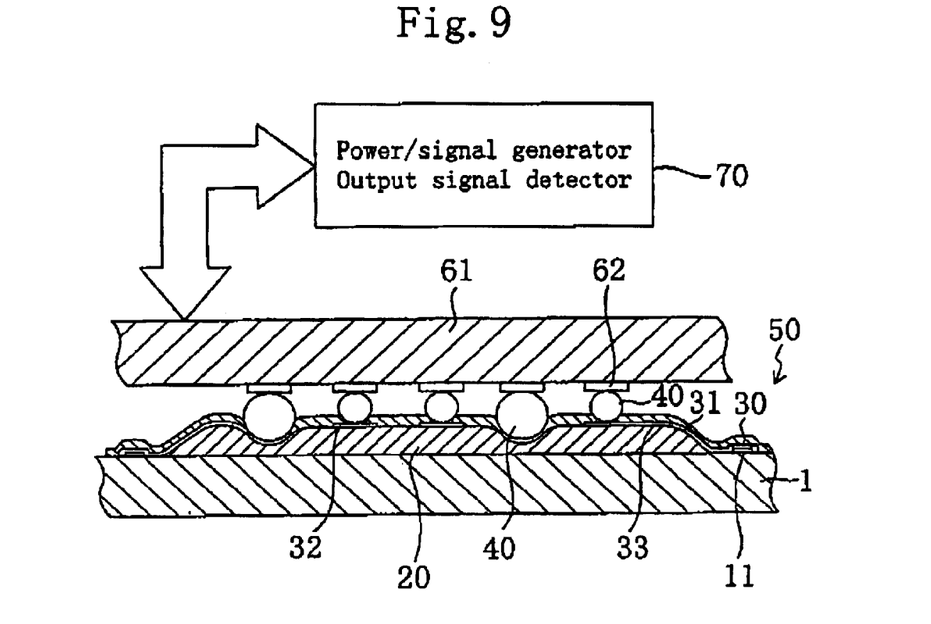
FIG. 9 is a sectional view for showing a testing method for a semiconductor device according to Embodiment 5.

Next, Embodiment 5 will be described as an example in which a semiconductor device is tested at wafer level. FIG. 9 is a partially exploded sectional view of a wafer in testing a semiconductor device according to this embodiment.

As is shown in FIG. 9, an element electrode 11 connected with a semiconductor element in a wafer 1 is disposed on the wafer 1, and a pad 30 is disposed on the element electrode 11. Also on the wafer 1, a low elasticity layer 20 of an insulating material with a low elastic modulus is provided in an area excluding the area where the pad 30 is disposed. The low elasticity layer 20 has a wedged slope portion in the vicinity of the area where the pad 30 is disposed. On the low elasticity layer 20 is disposed a land 32 functioning as an external electrode for inputting/outputting a signal between the semiconductor element of the wafer 1 and external equipment, and a metal wire 31 is formed so as to connect the land 32 and the pad 30. The pad 30, the metal wire 31 and the land 32 are made from the same metal layer, and together form a metal wiring pattern 33. On the land 32, a metal ball 40 functioning as an external electrode terminal is provided. Furthermore, the entire semiconductor device is covered with a solder resist film 50 so as to expose merely an area where the metal ball 40 is formed. In other words, the metal ball 40 is connected with the land 32 exposed in an opening of the solder resist film 50.

On the other hand, above the wafer 1, a testing board 61 including a large number of contact terminals 62 is provided with the contact terminals 62 facing downward. The testing board is positioned with each contact terminal 62 opposing each metal ball 40 on the wafer 1, so that the contact terminal 62 can come in contact with the metal ball 40 under pressure.

Furthermore, the testing board 61 is electrically connected with a testing system 70 equipped with a power/signal generator and an output signal detector. Although not shown in the drawing, the testing board 61 is provided with wires for electrically connecting the testing system 70 with the contact terminals 62.

In the testing method of this embodiment, even when the height of the metal balls 40 and the contact terminals 62 are not uniform, they can be definitely brought into contact with each other because their ununiform height can be absorbed owing to the low elasticity layer 20 on the wafer 1 functioning as an absorber. Thus, the semiconductor device can be tested at wafer level. Furthermore, the interval between the two-dimensionally arranged metal balls 40 serving as the external electrode terminals can be larger than the interval between the element electrodes 11 linearly arranged on the wafer, and hence, wires can be easily formed on the testing board 61.

In this case, a land-shaped terminal directly formed on the testing board 61 by plating or printing is used as the contact terminal 62. However, the metal ball 40 and the contact terminal 62 can be more definitely brought into contact with each other by providing, between the contact terminal 62 and the metal ball 40, a spring probe or a conductive sheet having conductive property in the vertical direction alone.

Moreover, the testing method of this embodiment can be adopted as a burn-in testing method by heating the semiconductor device on the wafer to a predetermined temperature; However, when the test is conducted at a high temperature as in the burn-in testing, the testing board 61 is preferably made from a glass substrate or a ceramic substrate having a coefficient of thermal expansion approximate to that of the semiconductor element.

The semiconductor device can be tested after dividing the wafer into individual semiconductor chips with the metal wires and the external electrode terminals provided.

As described so far, the semiconductor device of this invention has a structure that can be formed on a semiconductor substrate in a wafer shape and is compact and thin. Also, the connection between electrodes does not use a lead as in the conventional technique but uses a metal wiring layer. Accordingly, the semiconductor device is suitable to refinement and multi-pin application. Moreover, an elastic material layer is underlain and a metal wiring layer integrated with an external electrode is formed thereon. Accordingly, disconnection of the metal wiring layer can be prevented, and thermal stress applied to the external electrode can be relaxed, resulting in improving the reliability in connection in mounting the semiconductor device on a substrate.

Furthermore, in the method for manufacturing the semiconductor device, since the elastic material layer is formed on the semiconductor substrate, a flexible sheet can be omitted, resulting in decreasing the manufacturing cost. Also, fine wires can be formed, and thermal stress applied to solder connection in mounting the semiconductor substrate on a mother board can be relaxed. Accordingly, a compact semiconductor device with high performance can be manufactured at low cost.

INDUSTRIAL APPLICABILITY

The semiconductor device and the method for manufacturing the same according to this invention are applicable to general electronic equipment using a semiconductor integrated circuit including various transistors.

What is claimed is:

1. A semiconductor device comprising:

a semiconductor substrate including semiconductor elements;

element electrodes arrange on a main surface of said semiconductor substrate and electrically connected with said semiconductor elements;

a passivation film formed on the main surface of said semiconductor substrate, and having a first opening disposed on said element electrodes;

an elastic material layer formed on the main surface of said semiconductor substrate from an insulating elastic material;

an opening formed by partially removing said elastic material layer for exposing at least said element electrodes on said semiconductor substrate;

a metal wiring layer continuously formed to stretch from said element electrodes over said elastic material layer; and external electrodes formed as a part of said metal wiring layer on said elastic material layer for electrical connection with external equipment, wherein an entire lateral surface of said opening of said elastic material is separated from said element electrodes, an edge of said first opening of said passivation film projects from an edge of said opening of said elastic material layer toward the center of said opening, said elastic material layer is formed parallel to two sides of said semiconductor substrate, and said opening is band-shaped and parallel to said two sides of said semiconductor substrate.

2. The semiconductor device of claim 1, wherein said semiconductor substrate is in the state of a wafer.

3. The semiconductor device of claim 1, wherein said semiconductor substrate is in the state of a chip cut from a wafer.

4. The semiconductor device of claim 1, wherein said elastic material layer has a wedged section inclined to the surface of said semiconductor substrate in an end portion thereof in the vicinity of said opening.

5. The semiconductor device of claim 1, wherein said elastic material layer has a round-cornered section in an end portion thereof in the vicinity of said opening.

6. The semiconductor device of claim 1, further comprising:

a protecting film formed to cover said metal wiring layer and having a property to repel a conductive material; and openings each formed through said protecting film for exposing at least a part of each of said external electrodes of said metal wiring layer, wherein an external electrode terminal is formed at least on a pan of each of said external electrodes exposed in said openings of said protecting film.

7. The semiconductor device of claim 6, wherein at least a part of each of said external electrodes exposed in said openings of said protecting film also functions as said external electrode terminal.

8. The semiconductor device of claim 1, wherein said external electrode terminal is made from a metal ball formed to be in contact with each of said external electrodes.

9. The semiconductor device of claim 1, wherein said external electrode terminal is made from a conductive projection formed to be in contact with each of said external electrodes.

10. The semiconductor device of claim 1, further comprising a passivation film for protecting said semiconductor elements formed on said semiconductor substrate and having openings above said element electrodes, wherein said elastic material layer is formed on said passivation film.

11. The semiconductor device of claim 1, wherein a metal wiring layer is formed on an upper surface of said projection of said passivation film projecting from the edge of the opening of said elastic material layer toward the center of the opening.

12. The semiconductor device of claim 1, wherein said band-shaped opening is formed to reach an end perpendicular to said two parallel sides of said semiconductor substrate.

13. A semiconductor device comprising:

a semiconductor substrate including semiconductor elements;

element electrodes arranged on a main surface of said semiconductor substrate and electronically connected with said semiconductor elements;

a passivation film formed on the main surface of said semiconductor substrate, and having a first opening disposed on said element electrodes;

an elastic material layer formed on said passivation film from an insulating elastic material;

an opening formed by partially removing said elastic material layer for exposing at least said element electrodes on the main surface of said semiconductor substrate and an edge of said first opening of said passivation film projecting from an edge of said opening of said elastic material layer toward the center of said opening;

a metal wiring layer continuously formed to stretch from said element electrodes over said elastic material layer; and external electrodes formed as apart of said metal wiring layer on said elastic material layer for electrical connection with external equipment, wherein said elastic material layer is formed parallel to two sides of said semiconductor substrate, and said opening is band-shaped and parallel to said two sides of said semiconductor substrate.

14. The semiconductor device of claim 13, wherein a metal wiring layer is formed on an upper surface of said projection of said passivation film projecting from the edge of the opening of said elastic material layer toward the center of the opening.

15. The semiconductor device of claim 11, wherein said band-shaped opening is formed to reach an end perpendicular to said two parallel sides of said semiconductor substrate.

* * * * *

UNITED STATES PATENT AND TRADEMARK OFFICE
CERTIFICATE OF CORRECTION

PATENT NO.    : 6,812,573 B2
DATED         : November 2, 2004
INVENTOR(S)   : Nozomi Shimoishizaka et al.

It is certified that error appears in the above-identified patent and that said Letters Patent is hereby corrected as shown below:

<u>Column 13,</u>
Line 5, "arrange" should read -- arranged -- and
Line 59, "pan" should read -- part --.

Signed and Sealed this

Eighteenth Day of October, 2005

JON W. DUDAS
*Director of the United States Patent and Trademark Office*